United States Patent [19]

Panepinto, Jr.

[11] 4,266,285

[45] May 5, 1981

[54] ROW SELECTION CIRCUITS FOR MEMORY CIRCUITS

[75] Inventor: William Panepinto, Jr., Tewksbury, Mass.

[73] Assignee: Honeywell Information Systems, Inc., Waltham, Mass.

[21] Appl. No.: 52,999

[22] Filed: Jun. 28, 1979

[51] Int. Cl.³ ............................................. G11C 13/00
[52] U.S. Cl. ................................... 365/189; 365/200; 364/200
[58] Field of Search ....................... 365/189, 200, 230

[56] References Cited

U.S. PATENT DOCUMENTS

| | | | |
|---|---|---|---|
| 3,765,001 | 10/1973 | Beausoleil | 365/200 |
| 3,882,470 | 5/1975 | Hunter | 365/200 |

*Primary Examiner*—Terrell W. Fears
*Attorney, Agent, or Firm*—Faith F. Driscoll; Nicholas Prasinos; Ronald T. Reiling

[57] ABSTRACT

A memory subsystem includes a memory board comprising of a number of memory chips positioned at a corresponding number of physical row locations. The memory chips are one of two types selected to provide a predetermined memory capacity. The board further includes a number of decoder circuits connected to generate a corresponding number of sets of chip select signals in response to address signals applied thereto. These signals are applied through corresponding sets of logic circuits for application to the memory chips of each row. Additionally, logic gating circuits logically combine predetermined chip select signals for generating additional chip select signals. These additional chip select signals are applied through switches, the outputs of which are applied to predetermined ones of the sets of logic circuits. When the switches are positioned in a predetermined manner, the additional chip select signals are directed to only predetermined ones of the physical row locations via the sets of logic circuits. In this case, only the predetermined row locations are populated with one of the types of memory chips of much larger capacity. This provides the same predetermined memory capacity that is provided when all of the physical row locations are populated with the other type of memory chips of smaller capacity making possible reductions in manufacturing costs.

21 Claims, 1 Drawing Figure

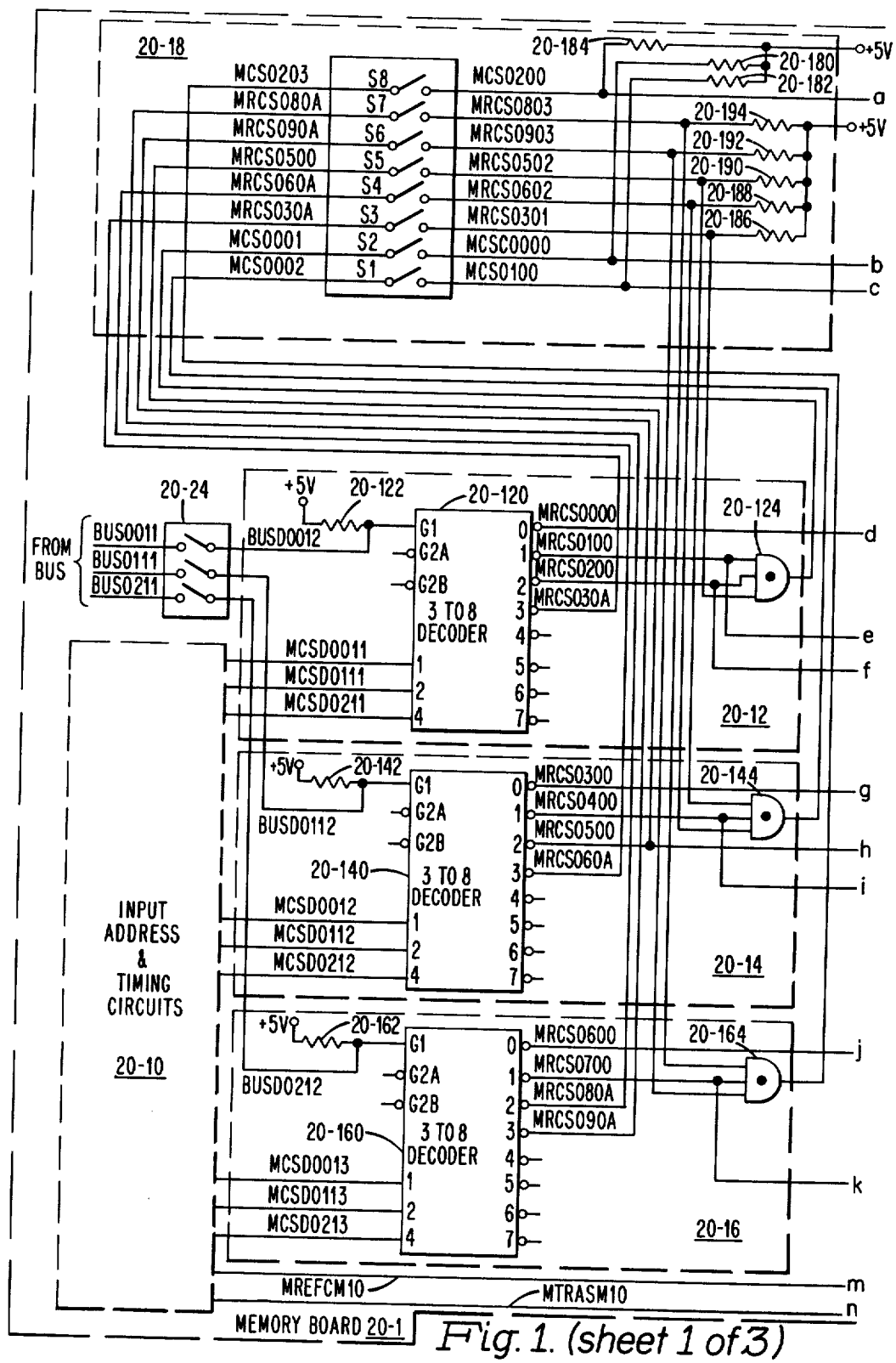
Fig. 1. (sheet 1 of 3)

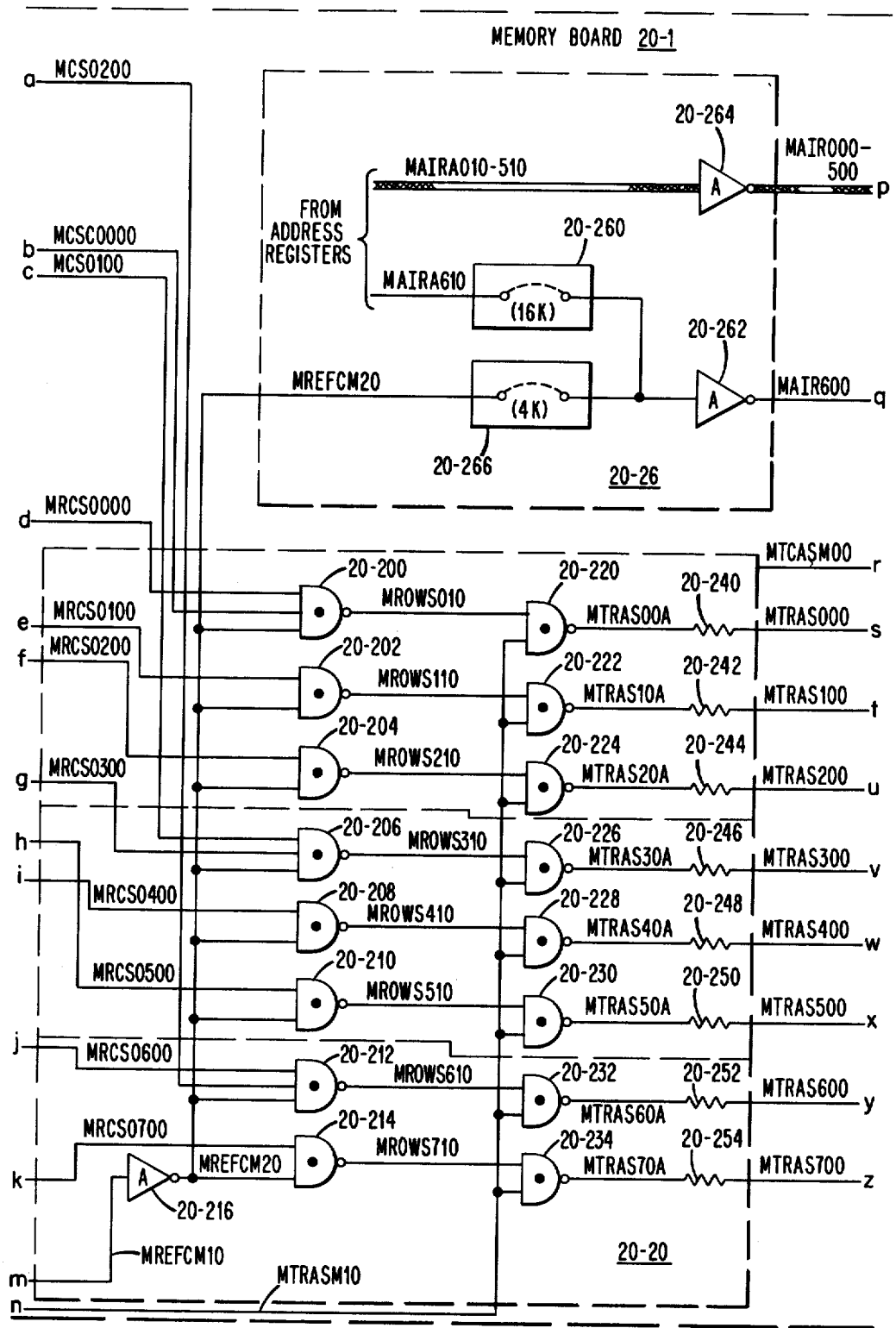
Fig. 1. (sheet 2 of 3)

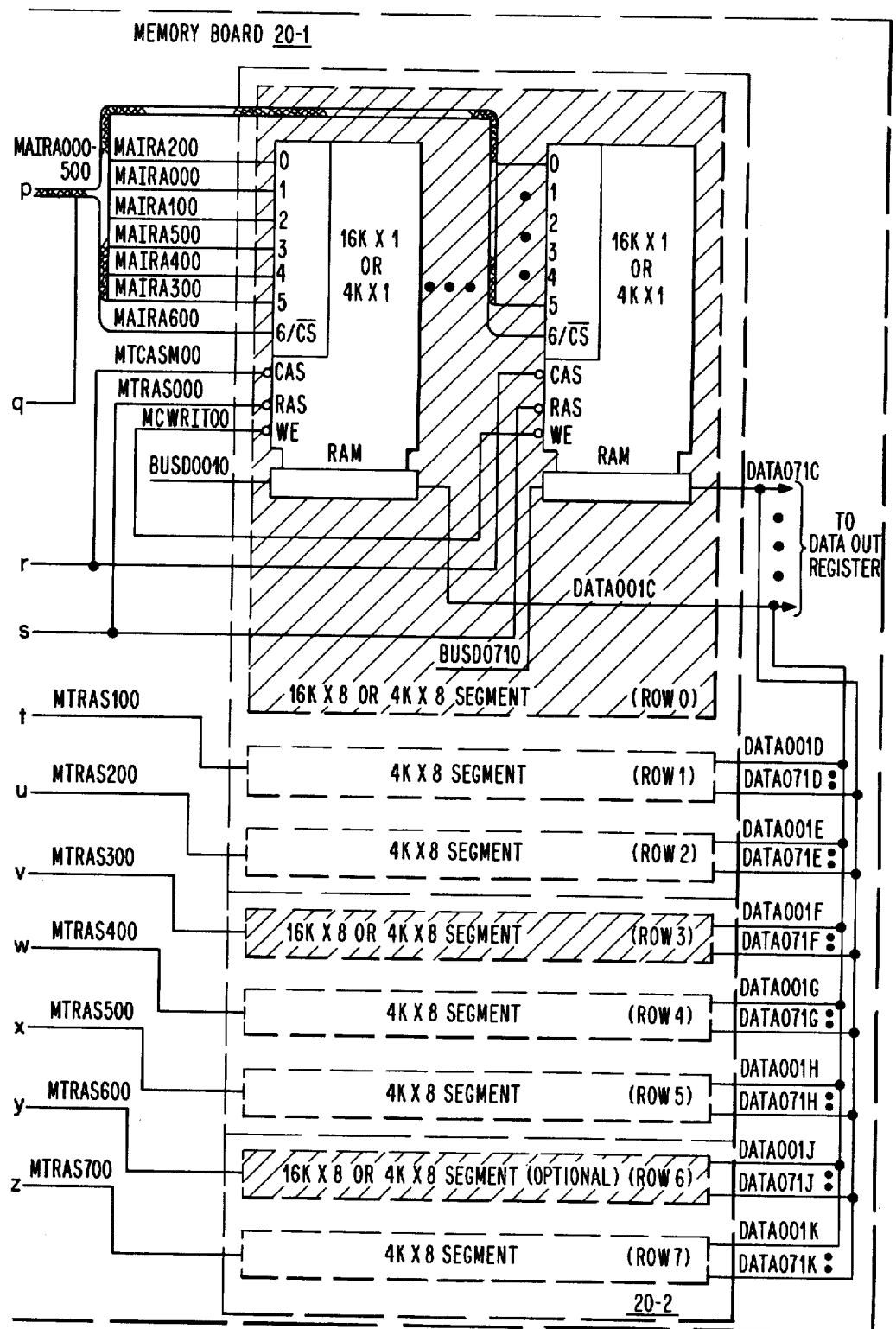
Fig. 1. (sheet 3 of 3)

ROW SELECTION CIRCUITS FOR MEMORY CIRCUITS

RELATED PATENT APPLICATIONS

"Rotating Chip Selection Technique and Apparatus", invented by Chester M. Nibby, Jr. and William Panepinto, Jr., bearing Ser. No. 921,292, filed July 3, 1978 and assigned to the same assignee as named herein.

BACKGROUND OF THE INVENTION

1. Field of Use

The present invention relates to memory systems and more particularly to apparatus and a method for simplifying the construction and cost of such systems.

2. Prior Art

It is well known to construct memory systems utilizing a number of small memory modules. Normally, a small increment of memory is selected for the module size because it has the advantage of losing less memory space in the event of failure. For further discussion of such systems, reference may be made to U.S. Pat. No. 3,803,560 which is assigned to the same assignee as named herein.

In addition to the above, modular memory systems permit ready expansion of the users memory system capacity or memory space when desired. In order to accommodate such expansion, memory system manufacturers have been required to construct a number of different memory systems having different memory capacities or different size increments of memory. This, in turn, has necessitated the construction of a number of different types of memory units.

One prior art system disclosed in U.S. Pat. No. 4,001,790 assigned to the same assignee as named herein employs an arrangement which can utilize the same memory board construction for any one of a number of memory modules connected to a memory controller. In the arrangement, one type of memory board (mother board) includes the control logic circuits and another type memory board (daughter board) contains the memory module. It is required that the memory module board be capable of being plugged into any one of a number of different positions.

In this type of arrangement, it is possible to upgrade and expand the memory system utilizing the two types of memory boards mentioned above. Here, the memory increment or memory size corresponds to the capacity of the daughter board.

The invention disclosed in the copending application of Chester M. Nibby, Jr. and William Panepinto, Jr. simplifies construction of the above type of memory subsystems through the utiliziation of rotating chip selection apparatus. While this type of memory subsystem can be constructed with other types of memory chips having larger capacities, this still requires modifications to be made to the subsystem and results in corresponding increases in memory subsystem capacity.

Accordingly, it is a primary object of the present invention to provide a technique and apparatus for constructing a low cost memory subsystem.

It is a further object of the present invention to provide a memory subsystem low in cost to construct and which can utilize lower cost memory chips.

SUMMARY OF THE PRESENT INVENTION

The above objects of the present invention are achieved in a preferred embodiment of a memory subsystem constructed in accordance with the technique and apparatus of the present invention. The memory subsystem includes a memory board comprising a number of rows of memory chips positioned at a corresponding number of physical row locations. In accordance with the present invention, the memory chips are of one of two types, both of which are selected to at least the same predetermined memory capacity. The board further includes decoder circuits connected to receive address signals coded to specify the physical row of chips being addressed. Also, such decoder circuits can be connected to receive address signals generated by the rotating chip selection apparatus of the previously referenced copending patent application of Chester M. Nibby, Jr. and William Panepinto, Jr. when it is desired to provide memory segments covering different ranges of memory addresses.

The decoder circuits in response to such address signals generate corresponding sets of chip select signals. The chip select signals are applied to corresponding sets of row select logic circuits which generate signals connected for enabling the memory chips positioned at the different physical row locations.

The memory board further includes additional logic gating circuits and a corresponding number of switches. The additional logic circuits couple to the decoder circuits and logically combine predetermined ones of the chip select signals for generating additional special chip select signals. The outputs of the additional logic gating circuits connect to different ones of the switches whose outputs connect to corresponding ones of the sets of row select logic circuits.

When the switches are positioned in a predetermined manner, the additional special chip select signals are applied only to the row select logic circuits of predetermined physical row locations. When so positioned, only the predetermined row locations are populated with one of the two types of memory chips having the larger memory capacity. When the switches are not so positioned, all of the physical row locations are populated with memory chips having the smaller memory capacity. By altering switch positions, it is possible to construct a memory subsystem with at least the same memory capacities from two different types of memory chips having significantly different capacities.

In the preferred embodiment, the lower capacity memory chip is a 4K chip while the higher capacity chip is a 16K chip. Accordingly, when the cost of higher capacity memory chips becomes lower in cost, a memory subsystem constructed in accordance with the teachings of the present invention can be immediately modified to utilize such lower cost memory chips without necessitating any design changes. In the preferred embodiment, eight rows of eight 4K chips are replaced by two or three rows of eight 16K chips. Additionally, the preferred embodiment includes additional switches which connect between the decoder circuits and additional logic circuits. These switches can be positioned to bypass the memory capacity of the memory subsystem as constructed from 16K chips. These switches provide different size segments useful in certain applications.

The novel features which are believed to be characteristic of the invention both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

The FIGURE shows in block diagram form, the organization of a memory board constructed in accordance with the principles of the present invention.

DESCRIPTION OF THE PREFERRED EMBODIMENT

The FIGURE, shows in detail, a portion of the circuits of a memory board constructed in accordance with the teachings of the present invention. As explained herein, when a memory section 20-2 is constructed utilizing 4K (1K = 1,024) RAM chips, the section is populated with eight rows of such chips organized into three memory segments as shown. More particularily, the segments include rows 0-2, 3-5 and 6-7 with each of the rows containing 8 4K × 1 bit memory chip. These chips are conventional in design and may take the form of the 4,096 word by one bit dynamic random access memory designated as the MK4027 manufactured by Mostek Corporation.

When the section 20-2 is constructed utilizing 16K RAM chips, the board is populated with three rows of such chips, one for each segment as indicated by the shaded blocks in the FIGURE. More particularly, the memory segments include rows 0, 3 and 6 wherein each row contains 8 16 × 1 bit memory chips. These chips are also conventional in design and may take the form of the 16,384 word by one bit dynamic random access memory designated as the MK4116 manufactured by Mostek Corporation.

It is seen from the FIGURE that the high order three bits of the address signals derived from an address register, not shown, are applied to the input terminals of three decoder circuits 20-120, 20-140 and 20-160 of blocks 20-12, 20-14 and 20-16 respectively. In the preferred embodiment, the high order three bits corresponding to a logical row address are generated and applied to the decoder circuits by the rotating chip select circuits of block 20-10. These circuits are described in detail in the referenced copending patent application of Chester M. Nibby, Jr. and William Panepinto, Jr. Three sets of these circuits are used to establish the desired starting addresses for each of the three memory segments of memory section 20-2. Since these circuits do not form a part of the present invention, they will not be further discussed herein. For additional information, the above copending patent application should be referenced.

As seen from the FIGURE, the decoder circuits 20-120, 20-140 and 20-160 are enabled by the +5 V applied to corresponding ones of the resistors 20-122, 20-142 and 20-162 when the switches of block 20-24 are in an open position. Also, when the switches of block 20-24 are closed, the decoder circuits 20-120, 20-140 and 20-160 are enabled in accordance with the logic signals BUS0011 through BUS0211 applied via an input bus. For purposes of the present invention, the decoder circuits can be considered to be enabled at all times (i.e., signals BUSD0012 through BUSD0212 are binary ONES).

As seen from the FIGURE, the sets of high order address signals MCSD0011-211, MCSD0012-212 and MCSD0013-213 are applied to the input terminals of the decoder circuits 20-120, 20-140 and 20-160 respectively. Each of the one of eight decoder circuits converts the signals into one of four row select signals MRCS00-03. Different ones of the row select signals of each set are applied as one input of a different one of the three groups of NAND gates. That is, row select signals MRCS0000, MRCS0100 and MRCS0200 are applied to NAND gates 20-200, 20-202 and 20-204 respectively of the first group of NAND gates. The row select signals MRCS0300, MRCS0400 and MRCS0500 are applied to NAND gates 20-206, 20-208 and 20-210 respectively. The NAND gates 20-212 and 20-214 of the third group receive row select signals MRCS0600 and MRCS0700 respectively. Each of the NAND gates 20-200 through 20-214 receive a refresh command signal MREFCM10 via an inverter circuit 20-216.

In accordance with the present invention, different ones of the row select signals from each of the decoder circuits 20-120, 20-140 and 20-160 are applied as inputs to one of AND gates 20-124, 20-144 and 20-164. The output terminal of each of these AND gates is applied via one of the switches of block 20-18 as an additional input to a first one of the NAND gates of each of the three groups of NAND gates.

More particularly, the sets of row select signals MRCS0100-MRCS030A, MRCS0400-MRCS060A, and MRCS0700-MRCS090A are applied to AND gates 20-124, 20-144 and 20-164 respectively. The output terminals of AND gates 20-124, 20-144 and 20-164 are applied via switches S2, S1 and S8 respectively to NAND gates 20-200, 20-206 and 20-212 as shown. When these switches are placed in the open position, this forces signals MCSC0000, MCSC0100 and MCSC0200 to binary ONES (i.e., +5 V) by corresponding ones of the termination resistors 20-180, 20-182 and 20-184.

The remaining switches S3 through S7 of section 20-18 are used to reduce the capacity of each of the three memory segments of section 20-2 when they are populated with 16K RAM chips. For example, the row select signal MRCS030A is applied to AND gate 20-124 via switch S3. When this switch is in the open position, the last 4K RAM is bypassed. Similarly, the row select signals MRCS0500 and MRCS060A are applied to AND gate 20-144 via switches S5 and S4 respectively. When these switches are in the open position, this bypasses 8K RAM. Lastly, row select signals MRCS080A and MRCS090A are applied to AND gate 20-164 via switches S7 and S6 respectively. These switches are utilized to bypass up to 8K RAM. When these switches are placed in the open position, this applies binary ONES (+5 V) via corresponding ones of the termination resistors 20-186 through 20-192.

The output signals MROWS010 through MROWS710 are, in turn, applied to a different one of the three groups of NAND gates of section 20-20. That is, signals MROWS010, MROWS110 and MROWS210 are applied to NAND gates 20-220, 20-222 and 20-224 respectively of the first group. The NAND gates 20-226, 20-228 and 20-230 of the second group receive signals MROWS310, MROWS410 and MROWS510 respectively. Lastly, the signals MROWS610 and MROWS710 are applied to NAND gates 20-232 and 20-234 of the third group. Each of the NAND gates 20-220 through 20-234 receive memory timing signal MTRASM10. This signal is normally set to a binary ONE state during a read or write cycle of operation.

As seen from the FIGURE, the output signals MTRAS000 through MTRAS700 are applied via corresponding ones of the resistors 20-240 through 20-254 as inputs to the memory chips of section 20-2. As mentioned, the section 20-2 is populated with 8 rows of 4K RAM chips or with 3 rows of 16K RAM chips. When populated with 16K RAM chips permanently mounted at physical row locations 0, 3 and 6, only the output signals MTRAS000, MTRAS300 and MTRAS600 are utilized. When any one of these signals is forced to a binary ZERO, this enables the address signals applied to the terminals of each RAM chip to be strobed or loaded into the row address register circuits internal to the chips as explained herein.

Various combinations of address signals MAIRA010 through MAIRA510 are applied via a corresponding number of inverter circuits 20-264 to the address input terminals of each of the 4K/16K RAM chips. It will be noted that the address signal MAIRA610 is applied via a jumper of block 20-260 and an inverter circuit 20-262 when 16K RAM chips populate section 20-2. When 4K RAM chips populate section 20-2, a jumper of block 20-266 is connected to apply the refresh command signal MREFCM20 as an input to inverter circuit 20-262. In the case of the 4K RAM chip, the extra address pin connection corresponds to a chip select terminal $(\overline{CS})$. The signals applied to these terminals are forced to binary ZEROS during refresh operations.

Although, not shown, another set of jumpers are utilized during refresh operations. One jumper provides for a RAS only refresh when section 20-2 is populated with 16K RAM chips. That is, the CAS clock signal is disabled during refresh operations. However, when section 20-2 is populated with 4K RAM chips, both the RAS and CAS clock signals are utilized during refresh operations. Since the manner in which refresh operations take place are not pertinent to an understanding of the present invention, the foregoing will not be further discussed herein.

It will be noted from the FIGURE that each chip receives a write enable signal MCWRIT000 generated in a conventional manner by circuits not shown and a different one of the data input signals BUSD0010 through BUSD0710 from the input bus. Corresponding ones of the sets of output signals DATA001C-DATA071C through DATA001K-DATA071K are wired ORED together and there after are applied to a data out register, not shown.

DESCRIPTION OF OPERATION

With reference to the FIGURE, the method and operation of the apparatus of the present invention will now be described. As seen from the FIGURE, a memory subsystem can be constructed by populating the memory board 20-1 with 4K RAM chips. When so populated, each chip provides a 64×64 array wherein the low order 6 bits of the RAM address select the row while the high order 6 bits select the column. The jumper of block 20-260 is absent while the jumper of block 20-264 is present. The address input terminals receive two sets of address signals. The first set represents the RAM chip row address and the second set represents the RAM chip column address.

The high order three address bits are decoded by each of the decoder circuits 20-120, 20-140 and 20-160 and this causes one of the row select signals MRCS0000 through MRCS090A to be forced to a binary ZERO. This designates which row of 4K RAM memory chips is being selected. Thereafter, an 8 bit byte is either written into or read from the designated location of the enabled 4K×8 segment of section 20-2.

It will be noted that when the 4K RAM chips are utilized, all of the switches S1, S2 and S3 are in the open position. Therefore, the row select signals are only directed to corresponding ones of the NAND gates 20-200 through 20-214 resulting in the switching of one of the signals MROWS010 through MROWS710 to a binary ONE. This in turn causes the corresponding one of the NAND gates 20-220 through 20-234 to force one of the signals MTRAS000 through MTRAS700 to a binary ZERO. This results in the designated row of 4K RAM chips being enabled. Now, the same memory board can be constructed utilizing 16K RAM chips, providing the same memory capacity. In this case, only rows 0 and 3 are populated with 16K RAM chips. Additionally, the switches S1 and S2 are placed in the closed position. The jumper of block 20-260 is present while the jumper of block 20-264 is absent. To take advantage of the larger capacity inherent in the 16K RAM chips, row 6 would also be populated with chips and switch S8 placed in the closed position. When the 16K RAM chips are utilized, each chip provides a 128×128 array. The 7 low order bits of the RAM address select the row while the 7 high order bits select the column. Again, two sets of address signals are applied to the RAM address terminals. The first set specifies the row address while the second set specifies the column address.

During operation, the application of the first set of address signals to decoder circuits 20-120, 20-140 and 20-160 forces one of its row select signals to a binary ZERO such as signal MRCS0200. This causes AND gate 20-124 to force signal MCS0001 to a binary ZERO. The closed switch S2 directs this binary ZERO signal to NAND gate 20-200. This gate forces signal MROWS010 to a binary ONE which results in signal MTRAS000 being forced to a binary ZERO. This results in all of the 16K RAM chips of row 0 being enabled.

From the above, it is seen that the arrangement of switches S1, S2 and S8 and AND gates 20-124, 20-144 and 20-160 direct all of the chip select signals to the first one of the rows of 16K RAM chips of the three memory segments of section 20-2. This provides a memory subsystem which has the same memory capacity as that constructed using 4K RAM chips. By having a single memory subsystem capable of being constructed with different capacity chips, no design changes are required to switch to high capacity chips in order to reduce manufacturing costs. As indicated previously, different 4K increments of each of the 16K RAM segment may be bypassed using different ones of the switches S3-S7. When placed in the open position, this essentially prevents the corresponding row select output signal from one of the decoder circuits 20-120, 20-140 and 20-160 from enabling a row of 16K RAM chips. That is, switch S3 when opened causes the first 16K×8 RAM segment to appear as a 12K×8 RAM segment. Similarly, switches S4 and S5 when opened in sequence causes the second 16K×8 RAM segment to appear as a 12K×8 and a 8K×8K RAM segment. In the same manner, through the utilization of switches S6 and S7, the third 16K×8 RAM memory segment can be made to resemble a 12K or 8K RAM segment.

It will be noted that the apparatus and method of the present invention permits a memory subsystem to be constructed from one type of memory board utilizing different capacity memory chips. This permits a manufacturer of memory subsystems to reduce manufacturing costs by selecting another higher capacity low cost chips for utilization in such subsystems. Also, this arrangement reduces maintenance costs by requiring one type of memory board.

It will be appreciated by those skilled in the art that the same arrangement may be utilized with other types of memory chips having different capacities. Also, other changes may be made to the preferred embodiment.

While in accordance with the provisions and statutes there has been illustrated and described the best form of the invention, certain other changes may be made without departing from the spirit of the invention as set forth in the appended claims and that in some cases, certain features of the invention may be used to advantage without a corresponding use of other features.

What is claimed is:

1. A memory subsystem comprising a memory board, said board including a control section and a memory section having at least one segment including a plurality of physical row locations of memory chips for providing a predetermined increment of addressable memory space, said memory section including:
   a number of addressable memory chips having one of two different memory capacities, each of said number of addressable memory chips having a first of said memory capacities being positioned at each of said plurality of physical row locations; and,
   said control section including:
      decoder circuit means connected to receive a portion of a plurality of row address signals and for generating a plurality of select signals in response to said row address signals;
      a plurality of logic circuits corresponding in number to said plurality of physical row locations, each of said logic circuits being connected to said decoder circuit means for enabling the addressing of said addressable memory chips haivng said first memory capacity at a different one of said plurality of physical row locations in accordance with a different predetermined one of said plurality of select signals;
      logic circuit means connected to said decoder circuit means for logically combining predetermined ones of said select signals for generating at least one alternate select signal; and,
      first switch means connected in series with said logic circuit means and to a first one of said plurality of logic circuits, said switch means when positioned in a predetermined manner being operative to apply said alternate select signal to said first one of said plurality of logic circuits, said first one of said logic circuits being conditioned by said alternate select signal in addition to said different predetermined one of said plurality of select signals for enabling the addressing of memory chips having a second of said memory capacities being positioned only at a first one of said plurality of said physical row locations, said memory chips having said second capacity providing at least the same predetermined increment of addressable memory space provided by the replaced plurality of rows of said memory chips having said first capacity.

2. The subsystem of claim 1 wherein said second memory capacity is much larger than said first memory capacity.

3. The subsystem of claim 2 wherein each of said number of memory chips of said first memory capacity is one-fourth the capacity of said number of memory chips having said second memory capacity.

4. The subsystem of claim 1 wherein first switch means includes a manually selectable switch having first and second positions, said switch being placed in said first position only when said memory section of said board is populated with memory chips having said first capacity and said switch being placed in said second position only when said memory section is populated with memory chips having said second capacity.

5. The subsystem of claim 4 wherein said first and second positions correspond to open and closed positions respectively of said switch.

6. The subsystem of claim 4 wherein said logic circuit means includes an AND gate having a number of input terminals and an output terminal, said number of input terminals for logically combining said predetermined ones of said select signals generated by said decoder circuit means specifying the selection of said memory chips positioned in row locations other than said first one of said row locations and said output terminal being connected in series with said manually selectable switch to said first one of said plurality of logic circuits, said AND gate generating said alternate select signal for enabling for addressing said memory chips having said second memory capacity of said first one of said physical row locations in response to said plurality of select signals.

7. The subsystem of claim 4 wherein said subsystem further includes:
   second switch means connected in series with said decoder circuit means and said logic circuit means, said second switch means when selectively positioned in a predetermined manner inhibiting the application of at least a predetermined one of said plurality of select signals from being applied to said logic circuit means thereby altering the memory capacity of said one segment.

8. The subsystem of claim 7 wherein said second switch means includes:
   a number of manually selectable switches having first and second positions, each switch being connected to apply a different one of said plurality of select signals to said logic circuit means and each of said number of switches having first and second positions, said switches being placed in said first positions only when said memory section is populated with said memory chips having said first capacity and said switches being placed in said second positions only when said memory section is populated with memory chips having said second capacity and for altering said memory capacity of said one segment.

9. The subsystem of claim 8 wherein said first and second positions respectively correspond to closed and open positions of said number of switches.

10. The subsystem of claim 8 wherein said number of switches is one and said memory capacity of said one segment is altered to provide a segment having three-fourths the capacity.

11. The subsystem of claim 8 wherein said number of switches is two and said memory capacity of said one segment is altered to provide a segment having one-half the capacity.

12. A memory subsystem comprising a memory board, said board including a control section and a memory section having a predetermined number of physical row locations of memory chips for providing a plurality of predetermined increments of addressable memory space, said memory section including:
- a number of addressable memory chips having one of two different memory capacities, each of said number of addressable memory chips having a first memory capacity being positioned at each of said predetermined number of row locations; and,
said control section including:
- a plurality of decoder circuits corresponding in number to said plurality of predetermined increments, each of said decoder circuits being connected to receive a portion of a plurality of row address signals and each of said decoder circuit means being operative to generate a plurality of select signals in response to said row address signals;
- a plurality of logic circuits corresponding in number to said predetermined number of physical row locations, each of said logic circuits being connected to a predetermined one of said plurality of decoder circuits for enabling the addressing of said addressable memory chips at a corresponding one of said row locations in response to a different predetermined one of said plurality of select signals from said predetermined one of said plurality of decoder circuits;
- a plurality of logic circuit means corresponding in number to said plurality of decoder circuits, each logic circuit means being connected to a different one of said plurality of decoder circuits for logically combining predetermined ones of said select signals to generate at least one alternate select signal; and,
- a plurality of first switch means corresponding in number to said plurality of decoder circuits, each first switch means being connected to a corresponding one of said plurality of said logic circuit means and to a corresponding one of said plurality of logic circuits, said plurality of switch means when positioned in a predetermined manner being operative to apply said alternate select signals to said corresponding ones of said plurality of logic circuits, said corresponding ones of said plurality of logic circuits being conditioned by said alternate select signals in addition to said different predetermined one of said plurality of select signals for enabling the addressing of memory chips having a second memory capacity positioned at only predetermined ones of said predetermined number of said physical row locations for providing at least the same predetermined increments of addressable memory space as the replaced said pluralities of rows of said number of memory chips having said first memory capacity.

13. The subsystem of claim 12 wherein said second memory capacity is much larger than said first memory capacity.

14. The subsystem of claim 12 wherein each of said number of memory chips of said first memory capacity is one-fourth the capacity of said number of memory chips having said second memory capacity.

15. The subsystem of claim 12 wherein each of said plurality of first switch means includes a manually selectable switch having first and second positions, said switch being placed in said first position only when said memory section is populated with memory chips having said first capacity and said switch being placed in said second position only when said memory section is populated with memory chips having said second capacity.

16. The subsystem of claim 15 wherein said first and second positions correspond to open and closed positions respectively of said switches.

17. The subsystem of claim 15 wherein each of said logic circuit means includes an AND gate having a number of input terminals and an output terminal, said number of input terminals for logically combining said predetermined ones of said select signals generated by one of said decoder circuits which specify the selection of said memory chips positioned in row locations other than a first one of a group of said row locations and said output terminal being connected in series with a corresponding one of said manually selectable switches to a first one of a corresponding group of said plurality of logic circuits connected to said one of said decoder circuits, said AND gate generating said alternate select signal for enabling said memory chips having said second capacity of one of said predetermined ones of said physical row locations in response to said plurality of select signals from said one of said decoder circuits.

18. The subsystem of claim 15 wherein said subsystem further includes:
- a plurality of second switch means connected in series with different ones of said number of decoder circuits and said plurality of logic circuit means, said plurality of second switch means when selectively positioned in a predetermined manner inhibiting the application of a predetermined one of said plurality of select signals from being applied to corresponding ones of said logic circuit means for altering the memory capacity of corresponding segments of said memory section.

19. The subsystem of claim 8 wherein said plurality of second switch means each includes:
- a number of manually selectable switches having first and second positions, each switch being connected to apply a different one of said plurality of select signals to a corresponding one of said plurality of logic circuit means and each of said number of switches having first and second positions, said switches being placed in said first positions only when said memory section is populated with said memory chips having said first capacity and said switches being placed in said second positions only when said memory section is populated with memory chips having said second capacity and for altering said memory capacity of a corresponding one of said segments.

20. A method of upgrading a memory subsystem requiring use of a single board type, said board including a memory section and a control section, said memory section having a plurality of physical row locations for accommodating a number of addressable memory chips of a first memory capacity to provide predetermined segments of addressable memory space; and,
said control section including a number of decoder circuits, each for generating a plurality of select signals in response to a row address and a plurality of logic circuits corresponding in number to said number of physical row locations, said logic circuits being connected to corresponding ones of said decoder circuits for enabling the addressing of said addressable memory chips of said first capacity at different ones of said rows in response to different predetermined ones of said select signals, said method comprising the steps of:

populating said memory section with only low cost memory chips having a second memory capacity much larger than said number of memory chips of said first memory capacity only at predetermined ones of said physical row locations in place of said plurality of rows of memory chips of said first capacity;

connecting each of a plurality of logic circuit means corresponding in number to said number of decoder circuits to a different one of said decoder circuits for logically combining predetermined ones of said select signals for generating at least one alternate select signal;

connecting each of a first plurality of switch means between a corresponding one of said plurality of logic circuit means and a predetermined one of said plurality of logic circuits;

positioning said first plurality of switch means in a predetermined manner to apply said alternate select signals to said predetermined ones of said plurality of logic circuits; and, each of said predetermined ones of said plurality of logic circuits generating signals in response to said alternate select signals in addition to a different predetermined one of said select signals for enabling the addressing of said memory chips of said second capacity for providing at least the same predetermined increment as said replaced rows of memory chips.

21. The method of claim 20 wherein said method further includes the steps of:

connecting a second plurality of said switch means in series with said decoder circuits and said logic circuit means; and, positioning said second plurality of said switch means in a predetermined manner for inhibiting predetermined ones of said pluralities of said select signals from being applied to said logic circuit means for reducing the memory capacity of different segments of said memory section.

* * * * *